United States Patent
Hong et al.

(10) Patent No.: US 11,342,436 B2
(45) Date of Patent: May 24, 2022

(54) SEMICONDUCTOR DEVICES

(71) Applicant: SAMSUNG ELECTRONICS CO., LTD., Suwon-si (KR)

(72) Inventors: Jaeho Hong, Hwaseong-si (KR); Yongseok Kim, Suwon-si (KR); Hyuncheol Kim, Seoul (KR); Seokhan Park, Seongnam-si (KR); Satoru Yamada, Yongin-si (KR); Kyunghwan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/801,508

(22) Filed: Feb. 26, 2020

(65) Prior Publication Data

US 2020/0403079 A1    Dec. 24, 2020

(30) Foreign Application Priority Data

Jun. 24, 2019  (KR) .................... 10-2019-0074954

(51) Int. Cl.
*H01L 29/51*     (2006.01)
*H01L 29/423*    (2006.01)
(Continued)

(52) U.S. Cl.
CPC ...... *H01L 29/511* (2013.01); *H01L 27/10823* (2013.01); *H01L 29/0847* (2013.01); *H01L 29/4236* (2013.01); *H01L 29/42364* (2013.01); *H01L 29/516* (2013.01); *H01L 27/10814* (2013.01)

(58) Field of Classification Search
CPC ............... H01L 29/511; H01L 29/4236; H01L 29/42364; H01L 29/516; H01L 27/10823; H01L 29/0847; H01L 27/10814; H01L 27/10876; H01L 29/78391; H01L 21/823437; H01L 21/823431; H01L 21/823462; H01L 29/40111; H01L 21/02175; H01L 27/10808; H01L 27/1085; H01L 27/10867
See application file for complete search history.

(56) References Cited

U.S. PATENT DOCUMENTS 6,054,730 A    4/2000 Noguchi
6,067,244 A    5/2000 Ma et al.
(Continued)

FOREIGN PATENT DOCUMENTS

JP    2003-0174150 A    6/2003
KR    10-0209710 B1     4/1999

*Primary Examiner* — Julia Slutsker
(74) *Attorney, Agent, or Firm* — Lee IP Law, P.C.

(57) ABSTRACT

A semiconductor device includes a substrate including a recess, a first gate insulation layer on a lower sidewall and a bottom of the recess, the first gate insulation layer including an insulation material having hysteresis characteristics, a first gate electrode on the first gate insulation layer inside the recess, a second gate electrode contacting the first gate electrode in the recess, the second gate electrode including a material different from a material of the first gate electrode, and impurity regions on the substrate and adjacent to sidewalls of the recess, bottoms of the impurity regions being higher than a bottom of the second gate electrode relative to a bottom of the substrate.

20 Claims, 17 Drawing Sheets

(51) Int. Cl.
*H01L 27/108* (2006.01)
*H01L 29/08* (2006.01)

(56) References Cited

U.S. PATENT DOCUMENTS

| | | | |
|---|---|---|---|
| 7,316,980 | B2 | 1/2008 | Zhuang et al. |
| 8,164,941 | B2 | 4/2012 | Kang et al. |
| 8,179,710 | B2 | 5/2012 | Minami |
| 8,188,533 | B2 | 5/2012 | Forbes |
| 9,007,823 | B2 | 4/2015 | Kurita et al. |
| 9,159,829 | B1 | 10/2015 | Ramaswamy |
| 9,882,016 | B2 | 1/2018 | Ramaswamy et al. |
| 2014/0138753 | A1* | 5/2014 | Ramaswamy ..... G11C 14/0027 257/295 |
| 2015/0214313 | A1* | 7/2015 | Oh ................... H01L 29/4236 257/2 |
| 2017/0125422 | A1* | 5/2017 | Kang ................ H01L 29/66795 |
| 2017/0338350 | A1 | 11/2017 | Flachowsky et al. |
| 2018/0166448 | A1 | 6/2018 | Cheng et al. |
| 2018/0190661 | A1* | 7/2018 | Wang ................ H01L 21/28088 |
| 2018/0277212 | A1* | 9/2018 | Kim ................... H01L 29/408 |
| 2020/0286790 | A1* | 9/2020 | Hong ................. H01L 27/088 |

* cited by examiner

SEMICONDUCTOR DEVICES

CROSS-REFERENCE TO RELATED APPLICATION

Korean Patent Application No. 10-2019-0074954, filed on Jun. 24, 2019, in the Korean Intellectual Property Office, and entitled: "Semiconductor Devices," is incorporated by reference herein in its entirety.

BACKGROUND

1. Field

Example embodiments relate to semiconductor devices. More particularly, example embodiments relate to semiconductor devices including transistors.

2. Description of the Related Art

In the case of a dynamic random-access memory (DRAM) device, one memory cell may include a transistor and a capacitor, and electrical characteristics of the DRAM device may vary depending on characteristics of the transistor. However, as integration of the DRAM device increases, forming a transistor with excellent electrical characteristics in such a DRAM device may be difficult.

SUMMARY

According to example embodiments, there is provided a semiconductor device, including a substrate with a recess, a first gate insulation layer on a lower sidewall and a bottom of the recess, the first gate insulation layer including an insulation material having hysteresis characteristics, a first gate electrode on the first gate insulation layer inside the recess, a second gate electrode contacting the first gate electrode in the recess, the second gate electrode including a material different from a material of the first gate electrode, and impurity regions on the substrate and adjacent to sidewalls of the recess, bottoms of the impurity regions being higher than a bottom of the second gate electrode relative to a bottom of the substrate.

According to example embodiments, there is provided a semiconductor device, including an interface insulation layer, a first gate insulation layer, a first gate electrode and impurity regions. The interface insulation layer may be formed on the substrate, and the interface insulation layer may have a first thickness. The first gate insulation layer may be formed on the interface insulation layer, and the first gate insulation layer may have a second thickness greater than the first thickness. The first gate insulation layer may include an insulation material having a hysteresis characteristic. The first gate electrode may be formed on the first gate insulation layer. The impurity regions may be formed at the substrate adjacent to sidewalls of the first gate electrode. The transistor may have one of a first threshold voltage and a second threshold voltage different from the first threshold voltage depending on a voltage level of the first gate electrode.

According to example embodiments, there is provided a semiconductor device, including a substrate, an interface insulation layer, a first gate insulation layer, a first gate electrode, a second gate electrode, impurity regions, a capacitor. The substrate may include a recess. The interface insulation layer may be formed on a lower sidewall and a bottom of the recess. The first gate insulation layer may be formed on the interface insulation layer, and the first gate insulation layer may include a ferroelectric material. The first gate electrode may be formed on the first gate insulation layer to fill a lower portion of the recess, and the first gate electrode may include a metal. The second gate electrode may contact the first gate electrode in the recess, and the second gate electrode may include a material different from a material of the first gate electrode. Impurity regions may be formed at the substrate adjacent to sidewalls of the recess. The capacitor may be electrically connected to one of the impurity regions. A transistor may have one of a first threshold voltage and a second threshold voltage different from the first threshold voltage depending on a voltage level of the first gate electrode.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
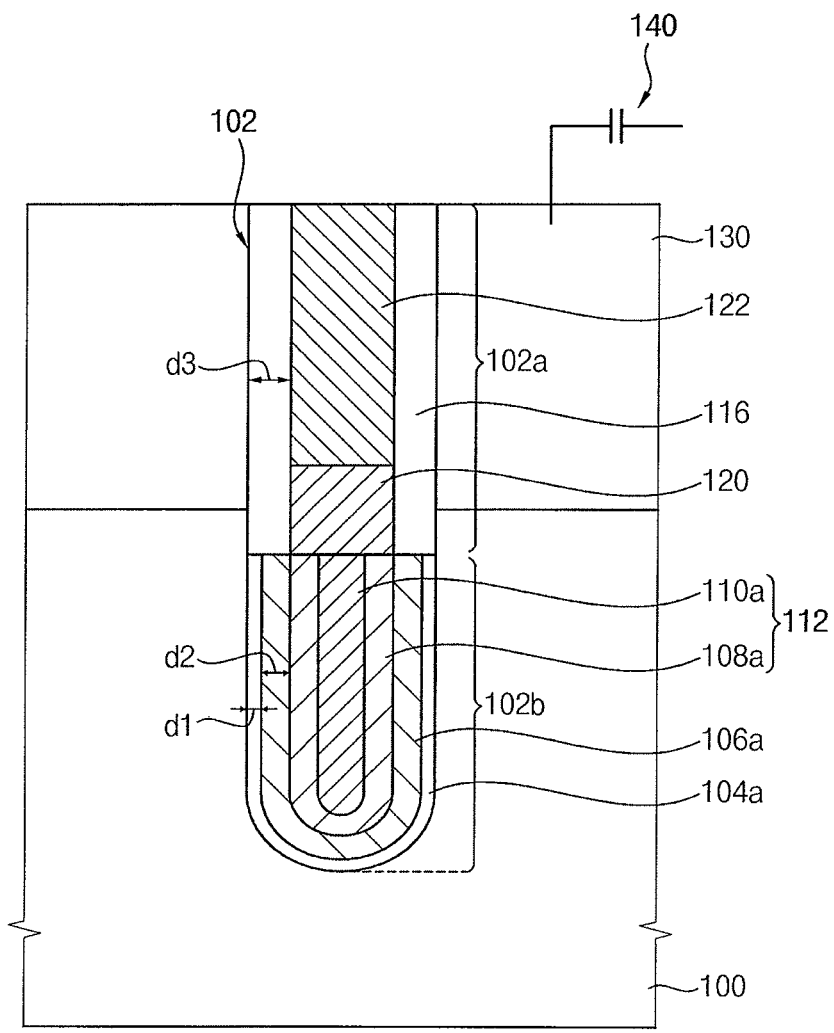
FIG. 1 illustrates a cross-sectional view of a transistor in accordance with example embodiments.

FIG. 1 is a cross-sectional view illustrating a transistor 10 in accordance with example embodiments. The transistor 10 shown in FIG. 1 may be a recessed channel transistor.

Referring to FIG. 1, the transistor 10 according to embodiments may include a recess 102 in a substrate 100, impurity regions 130 embedded in the substrate 100 and adjacent to sidewalls of the recess 102, e.g., upper surfaces of the impurity regions 130 and the substrate 100 may be level with each other, and first and second gate electrodes 112 and 120 in the recess 102. Further, the transistor 10 may include a first gate insulation pattern 106a between an inner sidewall of the recess 102 and the first gate electrode 112, with the first gate insulation pattern 106a including an insulation material having hysteresis characteristics.

In detail, the substrate 100 may include a semiconductor material, e.g., silicon, germanium, silicon-germanium, or the like, or a group III-V compound semiconductor, e.g., GaP, GaAs, GaSb, or the like. In some example embodiments, the substrate 100 may be a silicon-on-insulator (SOI) substrate or a germanium-on-insulator (GOI) substrate.

As further illustrated in FIG. 1, the substrate 100 may include the recess 102 therein disposed at a portion for forming a gate. In example embodiments, the recess 102 may extend in a first direction (e.g., into the page of FIG. 1) parallel to a surface of the substrate 100.

For example, the recess 102 may have a first depth, e.g., along a third direction, from a top surface of the substrate 100. For example, while FIG. 1 illustrates the first depth of the recess 102 extending from a top surface of the impurity region 130 that is embedded in the substrate 100, e.g., and has the top surface coplanar with that of the substrate 100, the recess 102 may extend from the top surface of the substrate 100.

A gate electrode may be formed in the recess 102. The gate electrode may include a first gate electrode 112 and a second gate electrode 120 stacked on top of each other, e.g., along the third direction. Hereinafter, a portion of the recess 102 that is higher than an upper surface of the first gate electrode 112 is referred to as an upper portion 102a of the recess 102. A portion of the recess 102 that is lower than the upper surface of the first gate electrode 112 is referred to as a lower portion 102b of the recess 102.

An interface insulation pattern 104a may be conformally formed on a lower sidewall and a bottom of the recess 102, e.g., the interface insulation pattern 104a may be conformal on the entire inner surface of the lower portion 102b of the recess 102. The interface insulation pattern 104a may not have hysteresis characteristic. In example embodiments, the interface insulation pattern 104a may include silicon oxide. The interface insulation pattern 104a may have a first thickness d1, e.g., as measured from the inner surface of the lower portion 102b of the recess 102. The interface insulation pattern 104a may be formed to prevent the substrate 100 and a first gate insulation pattern 106a from directly contacting each other. Therefore, the interface insulation pattern 104a may be formed between the substrate 100 and the first gate insulation pattern 106a.

The first gate insulation pattern 106a may be formed on the interface insulation pattern 104a, e.g., the first gate insulation pattern 106a may be conformal on the entire surface of the interface insulation pattern 104a. For example, as further illustrated in FIG. 1, uppermost surfaces of the first gate insulation pattern 106a and the interface insulation pattern 104a may be level with each other and define a topmost height of the lower portion 102b of the recess 102.

The first gate insulation pattern 106a may include an insulation material having a hysteresis characteristic. In example embodiments, the first gate insulation pattern 106a may include a ferroelectric material. For example, the first gate insulation pattern 106a may include hafnium oxide ($HfO_2$), zirconium oxide ($ZrO_2$), yttrium-doped zirconium oxide, yttrium-doped hafnium oxide, magnesium-doped zirconium oxide, magnesium-doped hafnium oxide, silicon-doped hafnium oxide, silicon-doped zirconium oxide, barium-doped titanium oxide, or the like.

In example embodiments, the first gate insulation pattern 106a may have a second thickness d2, e.g., as measured from an interface between the first gate insulation pattern 106a and the interface insulation pattern 104a. The second thickness d2 may be greater than the first thickness d1. Thus, a threshold voltage characteristic of the transistor may be dominantly controlled by the first gate insulation pattern 106a.

The first gate electrode 112 may be formed on the first gate insulation pattern 106a to fill the lower portion 102b of the recess 102. The first gate electrode 112 may include a metal. In example embodiments, the first gate electrode 112 may include a barrier metal pattern 108a and a metal pattern 110a. The barrier metal pattern 108a may be conformally formed on a surface of the first gate insulation pattern 106a, and the metal pattern 110a may be formed on the barrier metal pattern 108a to, e.g., completely, fill the lower portion of the recess 102, e.g., uppermost surfaces of the first gate insulation pattern 106a and the first gate electrode 112 may be level with each other.

In example embodiments, the barrier metal pattern 108a may include, e.g., titanium, titanium nitride, tantalum, tantalum nitride, tungsten nitride, tungsten carbon nitride, or the like. In example embodiments, the metal pattern 110a may include e.g., tungsten, aluminum, copper, or the like. For example, the metal pattern 110a may include tungsten.

The first gate electrode 112 may have a first height, e.g., along the third direction, from a bottom of the first gate electrode 112, e.g., from a bottommost point of the barrier metal pattern 108a, to the upper surface of the first gate electrode 112, e.g., to an uppermost surface of the metal pattern 110a. The first gate electrode 112 may include the metal, so that the first gate electrode 112 may have a low resistance.

The second gate insulation layer 116 may be formed on an upper sidewall of the recess 102, e.g., the second gate insulation layer 116 may be formed on inner sidewalls of the upper portion 102a of the recess 102. The second gate insulation layer 116 may include an insulation material different from a material of the first gate insulation pattern 106a.

In example embodiments, the second gate insulation layer 116 may, e.g., directly, contact portions of the first gate insulation pattern 106a and the interface insulation pattern 104a, e.g., the second gate insulation layer 116 may extend directly from the uppermost surfaces of the first gate insulation pattern 106a and the interface insulation pattern 104a. Also, the second gate insulation layer 116 may be connected with the first gate insulation pattern 106a and the interface insulation pattern 104a.

In example embodiments, the second gate insulation layer 116 may not include an insulation material having a hysteresis characteristic. Crystal defects included in the second gate insulation layer 116 may be less than crystal defects included in the first gate insulation pattern 106a. In example embodiments, the second gate insulation layer 116 may include silicon oxide.

In example embodiments, the second gate insulation layer 116 may have a third thickness d3, e.g., as measured from the inner surface of the upper portion 102a of the recess 102, greater than the first thickness d1. For example, the third thickness d3 may be greater than the second thickness d2, e.g., the third thickness d3 may equal a sum of the first thickness d1 and the second thickness d2.

As described above, the second gate insulation layer 116 may include a reduced number of crystal defects, and may have a thick thickness. Thus, leakage current of the transistor caused by the second gate insulation layer 116 may be reduced, e.g., due to the reduced number of crystal defects. However, the thickness of the second gate insulation layer 116 may not be limited thereto. For example, the third thickness d3 may be substantially the same as the second thickness d2 or less than the second thickness d2.

The second gate electrode 120 may be formed on the first gate electrode 112. A sidewall of the second gate electrode 120 may, e.g., directly, contact the second gate insulation layer 116. The second gate electrode 120 may include a material different from a material of the first gate electrode 112. In example embodiments, the second gate electrode 120 may include a conductive material having a work function different from a work function of the metal pattern 110a of the first gate electrode 112.

The second gate electrode 120 may serve to reduce a gate induced drain leakage (GIDL). Preferably, the work function of the second gate electrode 120 may be similar to the work function of the impurity region 130 serving as source/drain regions.

In example embodiments, the second gate electrode 120 may include a semiconductor material doped with impurities. For example, the second gate electrode 120 may include polysilicon doped with impurities. The polysilicon may be doped with impurities having a same conductivity type as a conductivity type of the impurities in the impurity region 130. In some example embodiments, the second gate electrode 120 may include a metal material having a work function similar to the work function of the impurity region 130.

The second gate electrode 120 may have a second height, e.g., along the third direction, from a bottom of the second gate electrode 120 to an upper surface of the second gate electrode 120. The second height (of the second gate electrode 120) may be lower than the first height (of the first gate electrode 112). That is, the first height of the first gate electrode 112 having a low resistance may be higher than the second height of the second gate electrode 120, so that an overall resistance of the gate in the recess 102 (i.e., of the transistor) may be decreased.

A capping pattern 122 may be formed on the second gate electrode 120. A sidewall of the capping pattern 122 may contact the second gate insulation layer 116. The capping pattern 122 may include, e.g., silicon nitride.

Thus, a gate structure may be formed in the recess 102. The gate structure in the recess 102, as described above and as illustrated in FIG. 1, may include the interface insulation pattern 104a, the first gate insulation pattern 106a, the second gate insulation layer 116, the first gate electrode 112, the second gate electrode 120, and the capping pattern 122.

The impurity regions 130 serving as source/drain regions may be formed in the substrate 100 adjacent to sidewalls of the gate structure, e.g., along the second direction. In example embodiments, the second gate electrode 120 and the impurity region 130 may be disposed to face each other in a horizontal direction, e.g., along the second direction. In example embodiments, the first gate electrode 112 and the impurity region 130 may not face each other in the horizontal direction, e.g., the first gate electrode 112 and the impurity region 130 may have a non-overlapping relationship in the second and third directions. That is, a bottom of the impurity region 130 may be higher than a top of the second gate electrode 120, e.g., along the third direction. The bottom of the impurity region 130 may be aligned with a portion of the sidewall of the second gate electrode 120, e.g., a height of the bottom of the impurity region 130 may be between heights of the top and bottom of the second gate electrode 120 relative to a bottom of the substrate 100.

In this case, a difference between the work function of the impurity region 130 and the work function of the second gate electrode 120 facing the impurity region 130 may be less than a difference between the work function of the impurity region 130 and the work function of the first gate electrode 112. Thus, a potential difference between the impurity region 130 and the second gate electrode 120 may be decreased, so that the GIDL generated between the impurity region 130 and the second gate electrode 120 may be reduced.

In example embodiments, circuits may be connected to the impurity region 130 in the transistor. For example, when the transistor serves as a part of a memory cell of a DRAM device, a capacitor 140 may be connected to one of the impurity regions 130 in the transistor. In addition, a bit line may be connected to another one of the impurity regions 130 in the transistor.

As described above, a transistor according to embodiments may include the first gate insulation pattern 106a having an insulation material with a hysteresis characteristic. Thus, the transistor may operate differently from a general transistor including a gate insulation layer including only insulation material (e.g., silicon oxide) having no hysteresis characteristic.

The first gate insulation pattern 106a may have a different polarity depending on an operating state of the transistor. Also, the transistor may have different threshold voltages depending on the polarity of the first gate insulation patterns 106a. In example embodiments, the transistor may be an N-type transistor.

In example embodiments, an ON voltage may be applied to the first gate electrode 112 to turn on the transistor. In this case, a negative charge may be induced in a channel region between the impurity regions 130 by a polarization polarity of the first gate insulation pattern 106a. That is, dipoles in the first gate insulation pattern 106a may have a positive charge adjacent to the channel region. Therefore, the threshold voltage of the transistor may be lowered.

Further, an OFF voltage may be applied to the first gate electrode 112 to turn off the transistor. In this case, a positive charge may be induced in the channel region between the impurity regions 130 by the polarization polarity of the first gate insulation pattern 106a. That is, dipoles in the first gate insulation pattern 106a may have a negative charge adjacent to the channel region. Therefore, the threshold voltage of the transistor may be increased.

Figure 2:
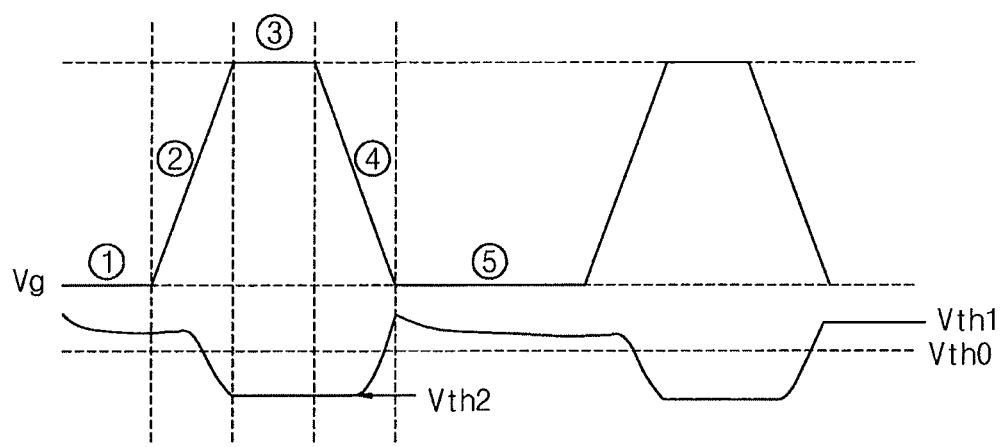
FIG. 2 illustrates a threshold voltage according to a gate voltage in a transistor in accordance with example embodiments.

In example embodiments, the gate voltage-drain current may have a hysteresis curve according to a bias condition of a gate voltage in the transistor. FIG. 2 illustrates a threshold voltage according to a gate voltage in a transistor in accordance with example embodiments.

Referring to FIG. 2, in a state in which a turn-off voltage is applied to the gate electrode, the gate voltage Vg applied to the gate electrode is gradually increased, i.e., from segment 1 to segment 3 in FIG. 2. The gate voltage Vg may be raised to a turn-on voltage, i.e., segment 3 in FIG. 2, to reach a sufficient voltage to turn-on the transistor. When the turn-on voltage is applied, the transistor may be turned on, i.e., segment 3 in FIG. 2.

Similarly, in a state in which a turn-on voltage is applied to the gate electrode, the gate voltage Vg applied to the gate electrode is gradually decreased, i.e., from segment 3 to segment 5 in FIG. 2. The gate voltage Vg may be lowered to a turn-off voltage, i.e., segment 5 in FIG. 2, to reach a sufficient voltage to turn-off the transistor. When the turn-off voltage is applied, the transistor may be turned off, i.e., segment 5 in FIG. 2.

In example embodiments, the transistor may have a first threshold voltage Vth1 in the turn-off state, and the first threshold voltage Vth1 may be higher than a threshold voltage Vth0 of a general transistor. Also, the transistor may have a second threshold voltage Vth2 in the turn-on state, and the second threshold voltage Vth2 may be lower than the threshold voltage Vth0 of the general transistor. Thus, the first threshold voltage Vth1 may be higher than the second threshold voltage Vth2.

As described above, the transistor may have one of the first and second threshold voltages depending on the voltage level of the first gate electrode. Thus, ON currents of the transistor may increase, and OFF currents of the transistor may decrease. That is, a value of ON/OFF current in the transistor may increase, and thus the transistor may have excellent electrical characteristics.

In the case of a DRAM device including the transistor, a data retention characteristic of the DRAM device may be improved by decreasing the leakage currents of the transistor. In addition, as the ON current of the transistor is increased, a data write operation and a refresh operation may be improved.

Hereinafter, other examples of transistors including an insulation material having a hysteresis characteristic will be described. Each transistor described below may be operated in the same manner as illustrated with reference to FIG. 2.

Figure 3:
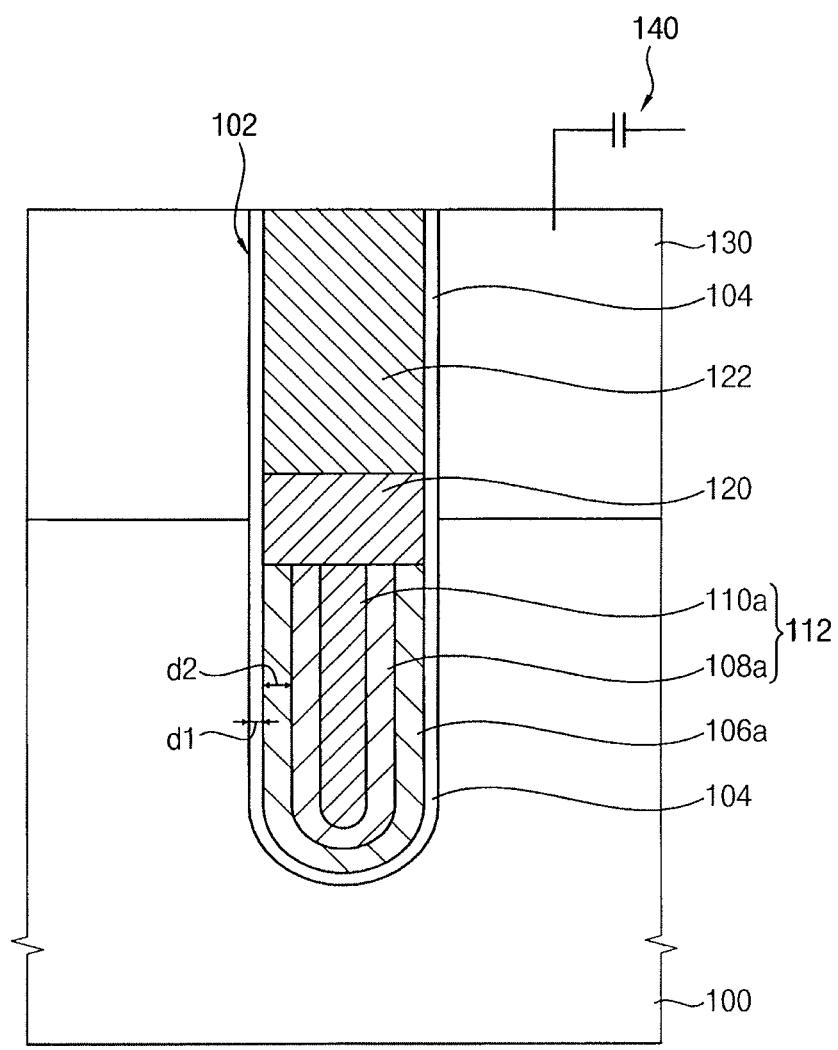
FIG. 3 illustrates a cross-sectional view of a transistor in accordance with example embodiments.

FIG. 3 is a cross-sectional view illustrating a transistor in accordance with example embodiments. The transistor shown in FIG. 3 is substantially the same as the transistor shown in FIG. 1, except for arrangements of elements within the gate structure.

Referring to FIG. 3, an interface insulation layer 104 may be conformally formed on a sidewall and a bottom of the recess 102 in the substrate 100, e.g., the interface insulation layer 104 may be conformally formed along the entire sidewall and bottom of the recess 102. In example embodiments, the interface insulation layer 104 may include silicon oxide. The interface insulation layer 104 may have the first thickness d1.

In example embodiments, the interface insulation layer 104 disposed at the upper portion of the recess 102 may serve as the second gate insulation layer illustrated with reference to FIG. 1. In other words, as illustrated in FIG. 3, the interface insulation layer 104 in the upper portion of the recess 102 may replace the second gate insulation layer 116 of FIG. 1.

The first gate insulation pattern 106a including an insulation material having the hysteresis characteristic may be formed on the interface insulation layer 104. In example embodiments, the first gate insulation pattern 106a may include the ferroelectric material. The first gate insulation pattern 106a may be conformally formed on a lower sidewall and the bottom of the recess 102. The first gate insulation pattern 106a may have the second thickness d2 greater than the first thickness d1.

The first gate electrode 112 may be formed on the first gate insulation pattern 106a to fill the lower portion of the recess 102. The second gate electrode 120 may be formed on the first gate electrode 112 and the first gate insulation pattern 106a. A sidewall of the second gate electrode 120 may contact the interface insulation layer 104.

The capping pattern 122 may be formed on the second gate electrode 120. A sidewall of the capping pattern 122 may contact the interface insulation layer 104.

As described above, a gate structure including the interface insulation layer 104, the first gate insulation pattern 106a, the first gate electrode 112, the second gate electrode 120, and the capping pattern 122 may be formed in the recess 102. The impurity region 130 serving as source/drain regions may be formed at the substrate 100 adjacent to sidewalls of the gate structure. In example embodiments, a bottom of the impurity region 130 may be disposed between a bottom and an upper surface of the second gate electrode 120. The bottom of the impurity region 130 may be disposed to face a portion of a sidewall of the second gate electrode 120. The impurity region 130 may not face, e.g., overlap, the first gate electrode 112.

Figure 4:
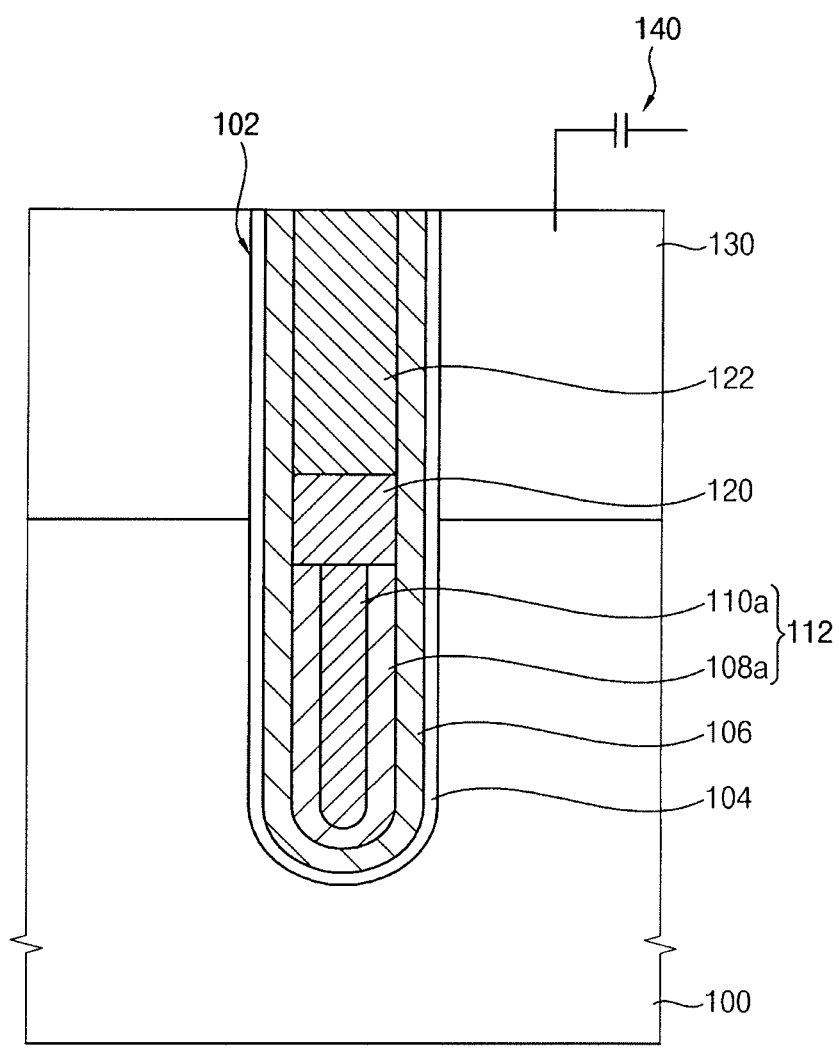
FIG. 4 illustrates a cross-sectional view of a transistor in accordance with example embodiments.

FIG. 4 is a cross-sectional view illustrating a transistor in accordance with example embodiments. The transistor shown in FIG. 4 is the same as the transistor shown in FIG. 1, except for arrangements of elements within the gate structure.

Referring to FIG. 4, the interface insulation layer 104 may be conformally formed on a sidewall and a bottom of the recess 102 in the substrate 100. A first gate insulation layer 106 including an insulation material having the hysteresis characteristic may be formed on the interface insulation layer 104, e.g., the first gate insulation layer 106 may extend continuously along an entire surface of the interface insulation layer 104 that faces an interior of the recess 102. That is, the interface insulation layer 104 and the first gate insulation layer 106 may be foil led along the, e.g., entire, sidewalls and the bottom of the recess 102.

The first gate electrode 112 may be formed on the first gate insulation layer 106 to fill the lower portion of the recess 102. The second gate electrode 120 may be formed on the first gate electrode 112. A sidewall of the second gate electrode 120 may contact the first gate insulation layer 106.

The capping pattern 122 may be formed on the second gate electrode 120. A sidewall of the capping pattern 122 may contact the first gate insulation layer 106.

As described above, a gate structure including the interface insulation layer 104, the first gate insulation layer 106, the first gate electrode 112, the second gate electrode 120, and the capping pattern 122 may be formed in the recess 102. The impurity region 130 may be formed at an upper portion the substrate 100 adjacent to sidewalls of the gate structure. In example embodiments, a bottom of the impurity region 130 may be disposed between a bottom and an upper surface of the second gate electrode 120. The bottom of the impurity region 130 may be disposed to face a portion of a sidewall of the second gate electrode 120. The impurity region 130 may not face the first gate electrode 112.

Figure 5:
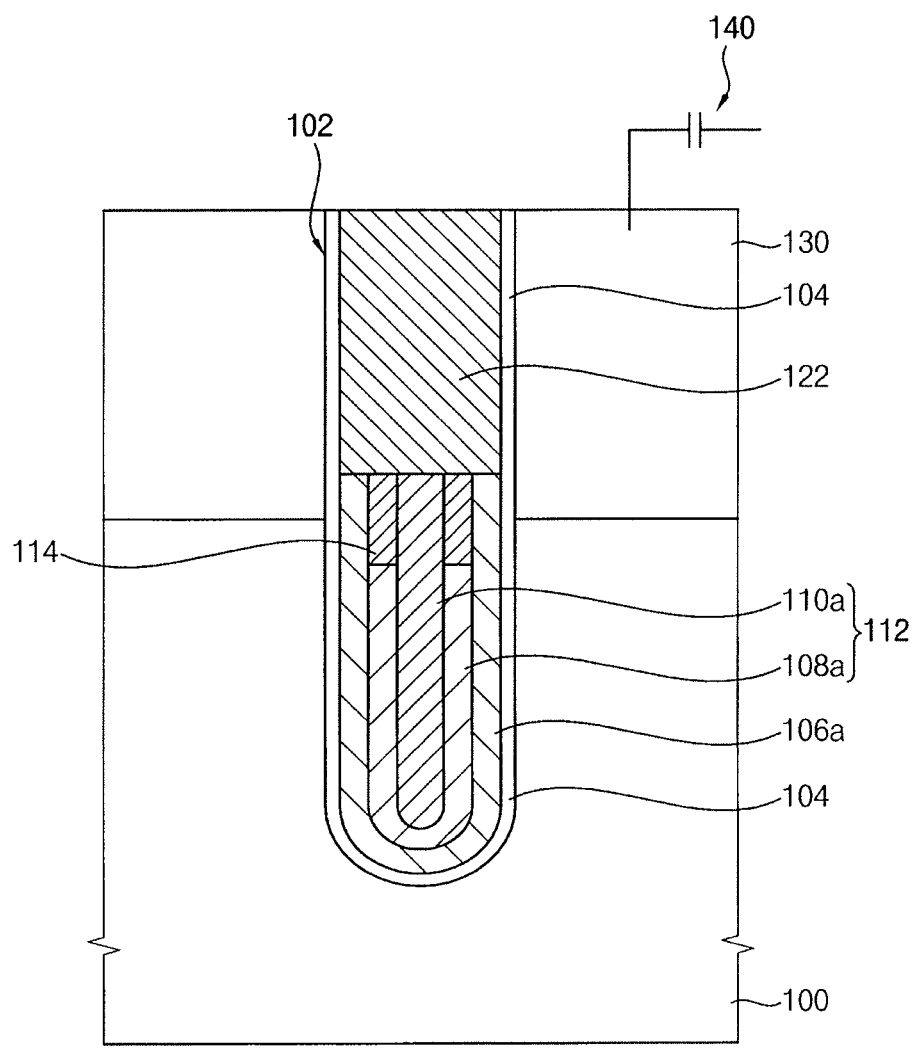
FIG. 5 illustrates a cross-sectional view of a transistor in accordance with example embodiments.
Figure 6:
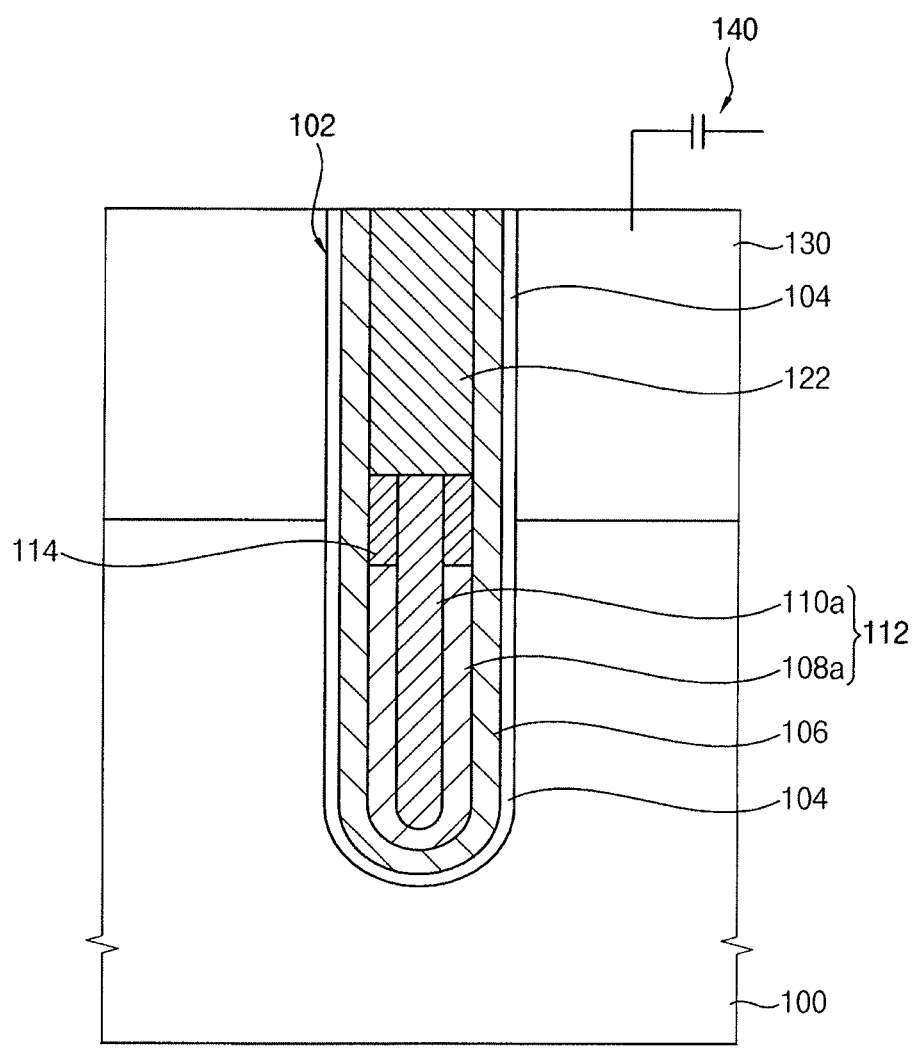
FIG. 6 illustrates a cross-sectional view of a transistor in accordance with example embodiments.

FIG. 5 is a cross-sectional view illustrating a transistor in accordance with example embodiments. FIG. 6 is a cross-sectional view illustrating a transistor in accordance with example embodiments. Each transistor shown in FIGS. 5 and 6 may be substantially the same as the transistor shown in FIG. 1, except for the gate structure.

Referring to FIG. 5, the interface insulation layer 104 may be conformally formed on a lower sidewall and a bottom of the recess 102 in the substrate 100. The first gate insulation pattern 106a including an insulation material having the hysteresis characteristic may be formed on the interface insulation layer 104. The first gate insulation pattern 106a may be conformally formed on the lower sidewalls and bottom of the recess 102.

A gate electrode may be formed on the first gate insulation pattern 106a to fill the lower portion of the recess 102. The gate electrode includes a first gate electrode 112 and a second gate electrode 114.

The first gate electrode 112 may include the barrier metal pattern 108a and the metal pattern 110a. The barrier metal pattern 108a may be conformally formed on an upper surface of the first gate insulation pattern 106a. The metal pattern 110a may be formed on the barrier metal pattern 108a to fill the lower portion of the recess 102. In this case, a top surface of the barrier metal pattern 108a may be lower than a top surface of the metal pattern 110a. Therefore, the top surface of the metal pattern 110a may protrude from a top surface of the barrier metal pattern 108a. The first gate electrode 112 may include a metal material.

The second gate electrode 114 may be formed on the top surface of the barrier metal pattern 108a. The second gate electrode 114 may contact an upper sidewall of the metal pattern 110a and the first gate insulation pattern 106a. The second gate electrode 114 may include a conductive material having a work function different from a work function of the metal pattern 110a.

The work function of the second gate electrode 114 may be similar to the work function of the impurity region 130. For example, the second gate electrode 114 may include polysilicon doped with impurities. The polysilicon may be doped with impurities having a conductivity type the same as a conductive type of the impurities in the impurity region 130. For example, the second gate electrode 114 may include a metal material different from a material of the metal pattern 110a. For example, the second gate electrode 114 may be formed by a surface treatment of the barrier metal pattern 108a. In this case, the second gate electrode 114 may include a metal included in the barrier metal pattern 108a.

The capping pattern 122 may be formed on the metal pattern 110a and the second gate electrode 114. The capping pattern 122 may fill the upper portion of the recess 102. A sidewall of the capping pattern 122 may contact the interface insulation layer 104.

In some example embodiments, as shown in FIG. 6, the interface insulation layer 104 and the first gate insulation layer 106 may be conformally formed on a sidewall and a bottom of the recess 102 in the substrate 100. Thus, a sidewall of the capping pattern 122 may contact the first gate insulation layer 106.

FIGS. 7 to 14 are cross-sectional views illustrating stages in a method of manufacturing a transistor in accordance with example embodiments.

Figure 7:
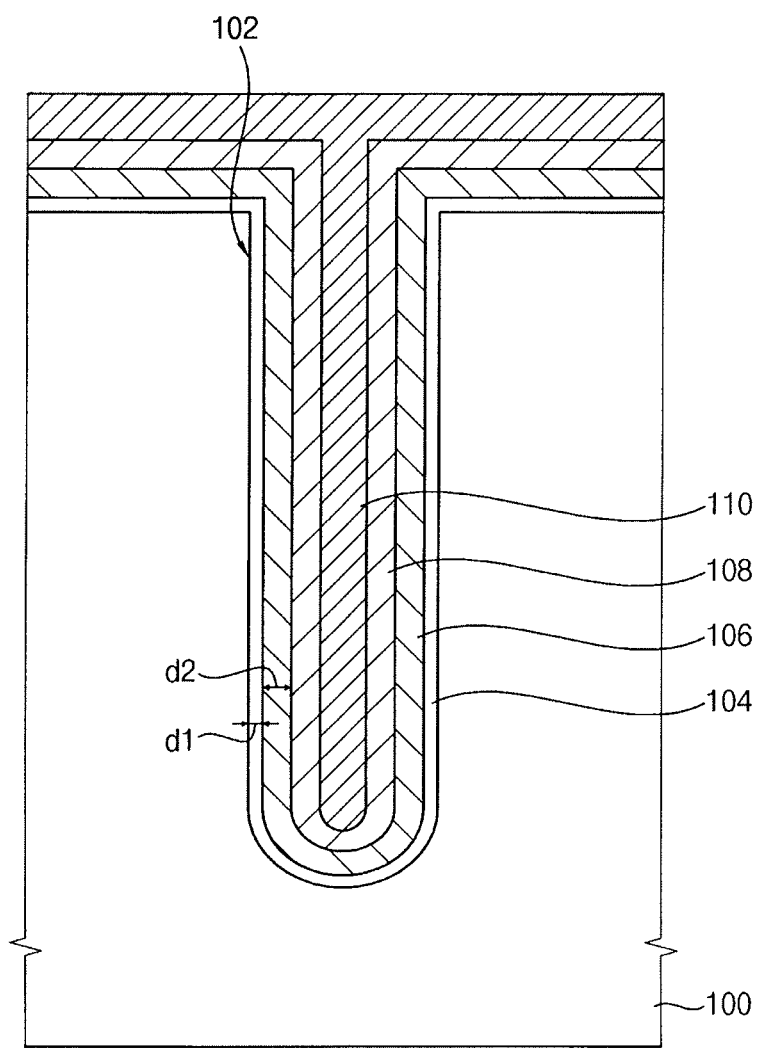
FIGS. 7 to 14 illustrate cross-sectional views of stages in a method of manufacturing a transistor in accordance with example embodiments.

Referring to FIG. 7, an upper portion of the substrate 100 may be partially etched to form the recess 102. The interface insulation layer 104 may be conformally formed on an inner surface of the recess 102 and an upper surface of the substrate 100. For example, the interface insulation layer 104 may include an oxide, e.g., silicon oxide.

The first gate insulation layer 106 may be conformally formed on the interface insulation layer 104. The first gate insulation layer 106 may include an insulation material having a hysteresis characteristic. In example embodiments, the first gate insulation layer 106 may include a ferroelectric material. In example embodiments, the interface insulation layer 104 may be formed to have a first thickness, and the first gate insulation layer 106 may have a second thickness greater than the first thickness.

The barrier metal layer 108 may be conformally formed on the first gate insulation layer 106. In example embodiments, the barrier metal layer 108 may include, e.g., titanium, titanium nitride, tantalum, tantalum nitride, tungsten nitride, tungsten carbon nitride, or the like. The metal layer 110 may be formed on the barrier metal layer 108 to fill the recess 102. The metal layer 110 may include, e.g., tungsten.

Figure 8:
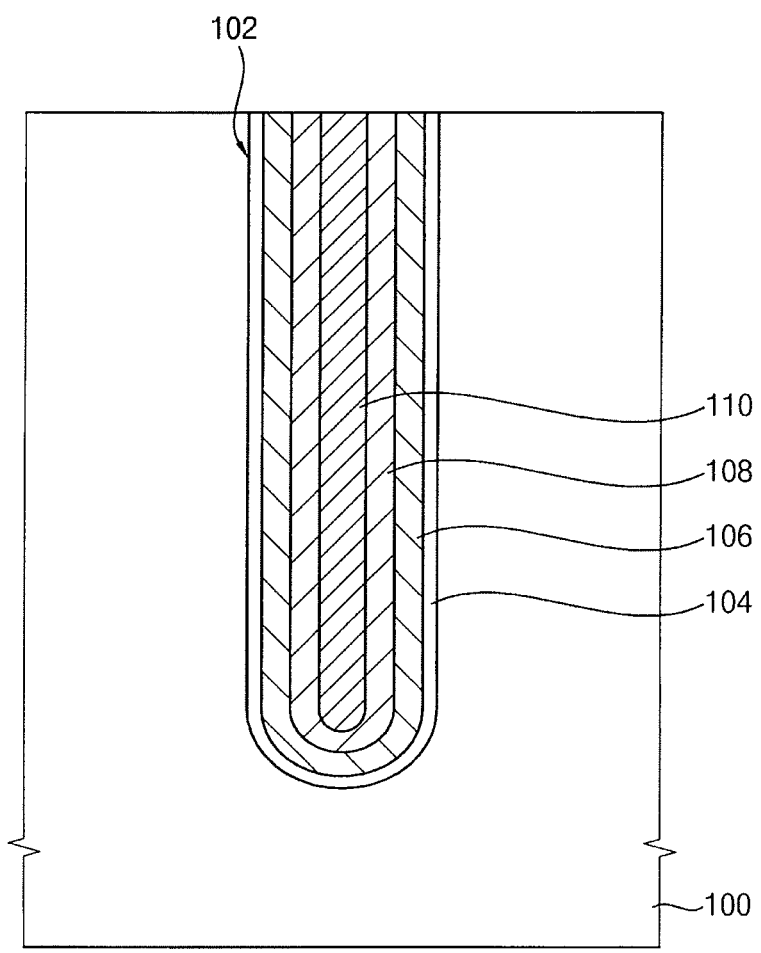

Referring to FIG. 8, the metal layer 110, the barrier metal layer 108, the first gate insulation layer 106, and the interface insulation layer 104 may be planarized until an upper surface of the substrate 100 is exposed. The planarization process may include, e.g., a chemical mechanical polishing (CMP) process and/or an etch back process.

Figure 9:
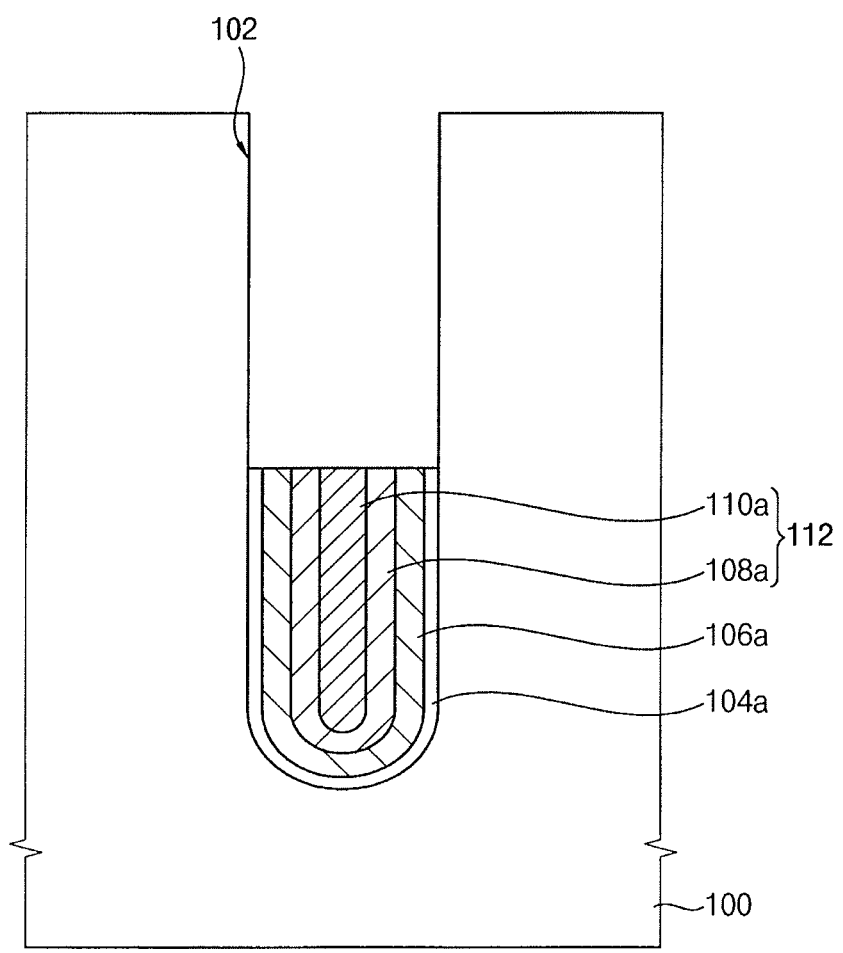

Referring to FIG. 9, the metal layer 110, the barrier metal layer 108, the first gate insulation layer 106, and the interface insulation layer 104 disposed at an upper portion of the recess 102 may be removed to form the interface insulation pattern 104a, the first gate insulation pattern 106a, the barrier metal pattern 108a, and the metal pattern 110a. The interface insulation pattern 104a, the first gate insulation pattern 106a, and the barrier metal pattern 108a may be conformally formed on the lower sidewall and the bottom of the recess 102. Further, the metal pattern 110a may be formed on the barrier metal pattern 108a.

Thus, the interface insulation pattern 104a and the first gate insulation pattern 106a may be formed in the lower portion of the recess 102. In addition, the first gate electrode 112 including the barrier metal pattern 108a and the metal pattern 110a may be formed on the first gate insulation pattern 106a.

In some example embodiments, after the removing process, the interface insulation layer 104 disposed at the upper portion of the recess 102 may remain to have a small thickness.

Figure 10:
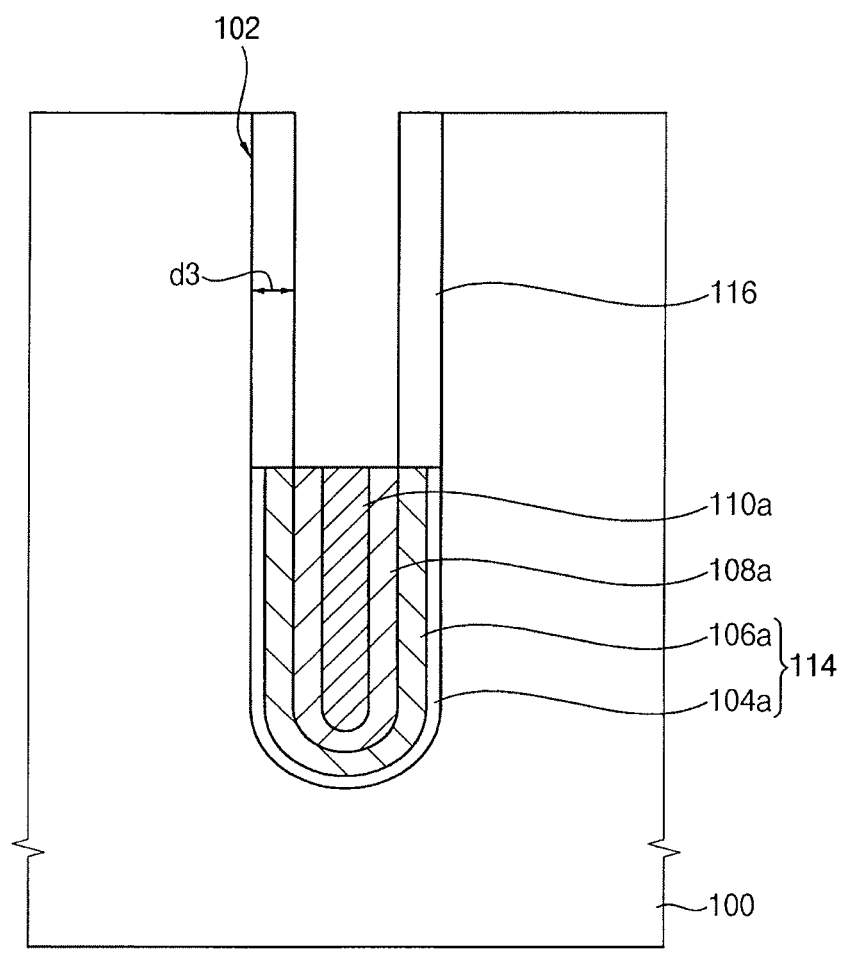

Referring to FIG. 10, the second gate insulation layer 116 may be formed on an upper sidewall of the recess 102. The second gate insulation layer 116 may include an insulation material different from an insulation material of the first gate insulation layer. In example embodiments, the second gate insulation layer 116 may include silicon oxide. In example embodiments, the second gate insulation layer 116 may have the third thickness d3 greater than the first thickness d1, e.g., the third thickness d3 may be greater than the second thickness d2.

In example embodiments, an insulation layer may be conformally formed on an upper sidewall of the recess 102 and the surfaces of the interface insulation pattern 104a, the first gate insulation pattern 106a, and the first gate electrode 112. The insulation layer may be anisotropically etched to expose an upper surface of the first gate electrode 112, so that the second gate insulation layer 116 may be formed.

In some example embodiments, the metal layer 110, the barrier metal layer 108, and the first gate insulation layer 106 disposed at the upper portion of the recess 102 may be only removed during the etching process illustrated with reference to FIG. 9. Thus, the interface insulation layer 104 may remain along the sidewall and the bottom of the recess 102. In this case, the process of forming the second gate insulation layer may be omitted. In this case, the transistors shown in FIG. 3 may be manufactured by subsequent processes.

Figure 11:
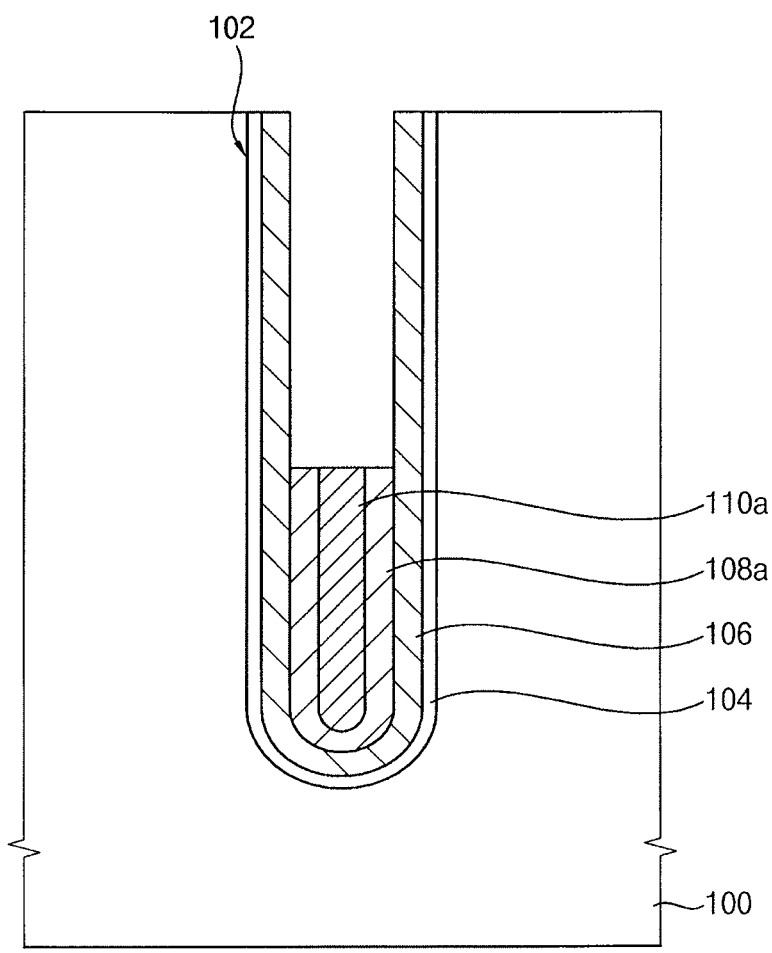

In some example embodiments, the metal layer 110 and the barrier metal layer 108 disposed at the upper portion of the recess 102 may be only removed during the etching process illustrated with reference to FIG. 9. Thus, as shown in FIG. 11, the interface insulation layer 104 and the first gate insulation layer 106 may remain along the sidewall and the bottom of the recess 102. In this case, the process of forming the second gate insulation layer may be omitted. In this case, the transistors shown in FIG. 4 may be manufactured by subsequent processes.

Figure 12:
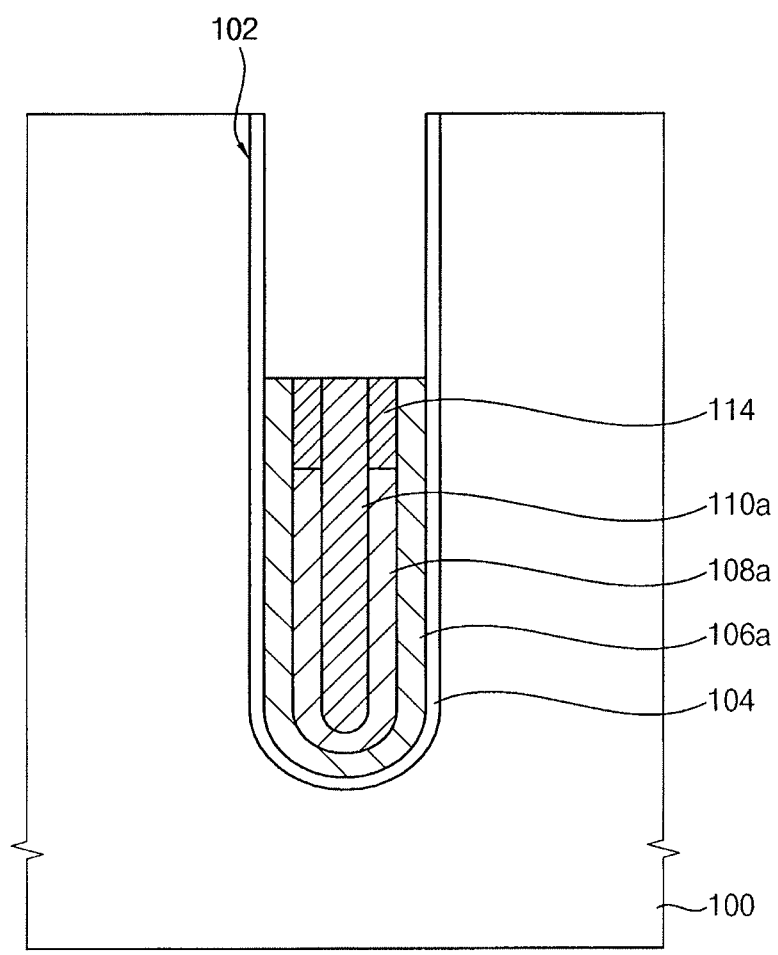

In some example embodiments, after the etching process illustrated with reference to FIG. 9, a surface treatment may be performed at a top surface of the barrier metal pattern 108a. Thus, a portion of the barrier metal pattern may be converted to a material having different work function, as shown in FIG. 12. Alternately, an upper portion of the barrier metal pattern 108a may be removed, and then a metal material or polysilicon material may be replaced with a removed portion. Thus, a second gate electrode 114 may be formed on the barrier metal pattern 108a. In this case, the transistors shown in FIG. 5 may be manufactured by subsequent processes.

Figure 13:
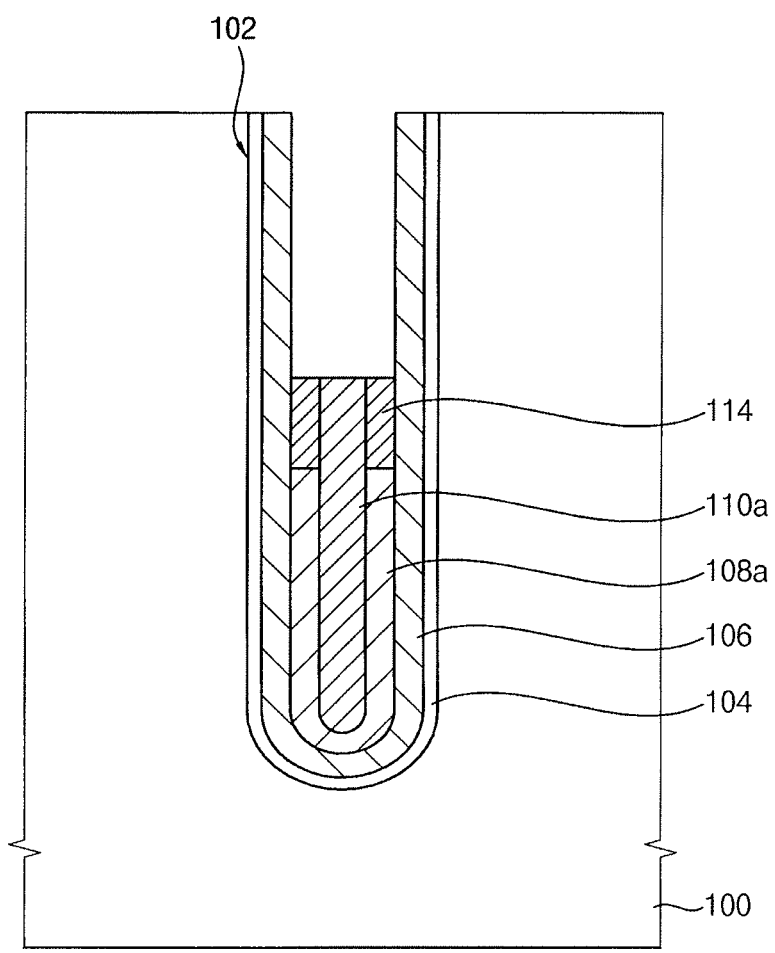

In some example embodiments, the metal layer 110 and the barrier metal layer 108 disposed at the upper portion of the recess 102 may be only removed during the etching process illustrated with reference to FIG. 9. After the etching process, a surface treatment may be performed at a top surface of the barrier metal pattern 108a. Thus, a portion of the barrier metal pattern may be converted to a material having different work function, as shown in FIG. 13. Alternately, an upper portion of the barrier metal pattern 108a may be removed, and then a metal material or polysilicon material may be replaced with a removed portion. Thus, a second gate electrode 114 may be formed on the barrier metal pattern 108a. In this case, the transistors shown in FIG. 6 may be manufactured by subsequent processes.

Figure 14:
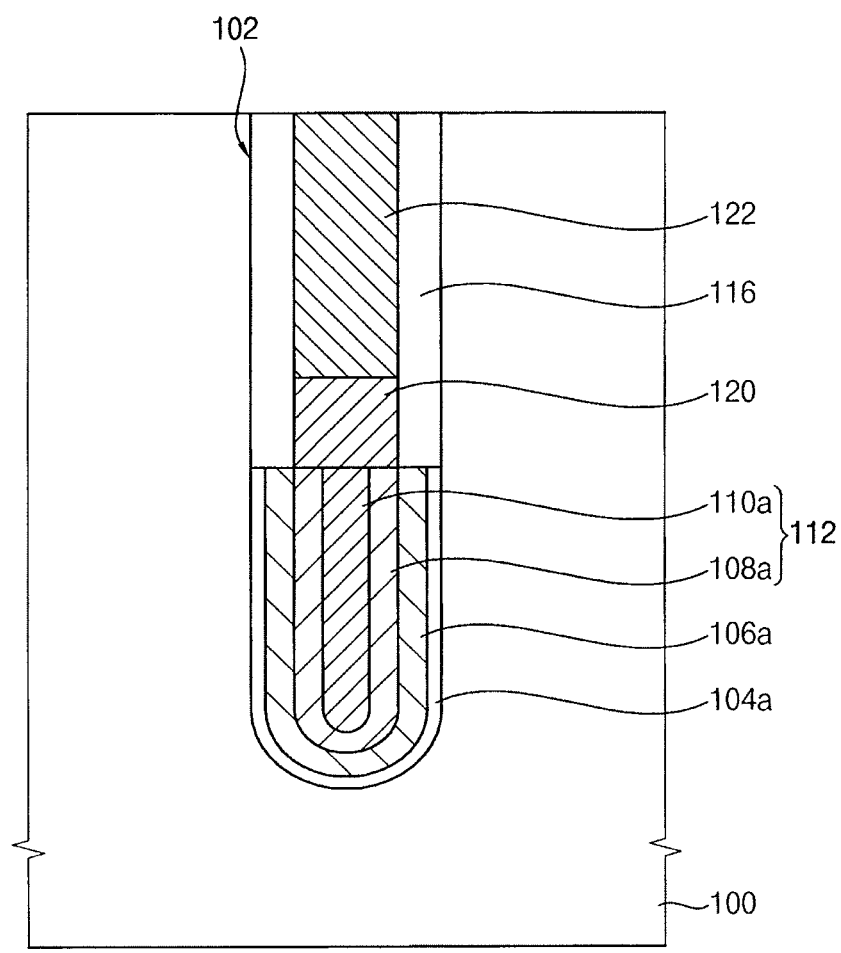

Referring to FIG. 14, the second gate electrode 120 may be formed on the first gate electrode 112. The capping pattern 122 may be formed on the second gate electrode 120. The second gate electrode 120 and the capping pattern 122 may fill the upper portion of the recess 102.

In example embodiments, the second gate electrode 120 may include a semiconductor material doped with impurities. For example, the second gate electrode 120 may include polysilicon doped with impurities. The polysilicon may be doped with impurities having a conductivity type the same as a conductive type in an impurity region serving as source/drain regions. The capping pattern 122 may include, e.g., silicon nitride.

By performing the above processes, a gate structure including the interface insulation pattern 104a, the first gate insulation pattern 106a, the second gate insulation layer 116, the first gate electrode 112, the second gate electrode 120, and the capping pattern 122 may be formed in the recess 102.

Referring to FIG. 1 again, impurities may be doped on the substrate 100 to form the impurity region 130 at the substrate 100 adjacent to sidewalls of the gate structure. In example embodiments, a bottom of the impurity region 130 may be disposed between a bottom of the second gate electrode 120 and an upper surface of the second gate electrode 120. The bottom of the impurity region 130 may be disposed to face a portion of a sidewall of the second gate electrode 120 in the horizontal direction. In some example embodiments, the doping process for forming the impurity region 130 may be performed before forming the recess 102 illustrated with reference to FIG. 7.

Hereinafter, transistors of various types including an insulation material having a hysteresis characteristic will be described. The transistors described below may operate in the same manner as illustrated with reference to FIG. 2.

Figure 15:
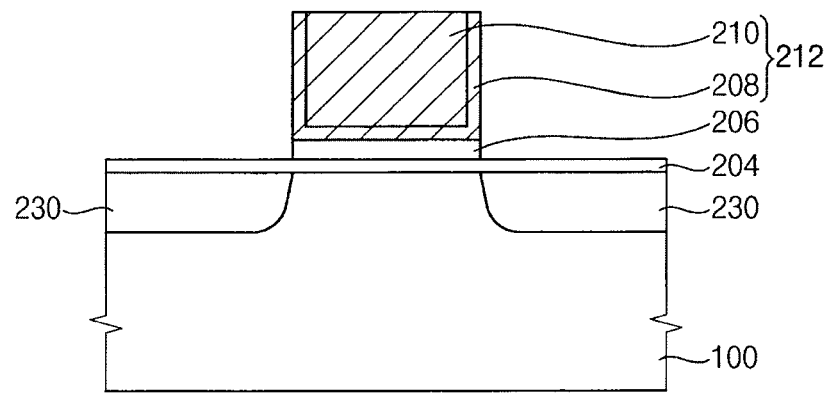
FIG. 15 illustrates a cross-sectional view of a transistor in accordance with example embodiments.

FIG. 15 is a cross-sectional view illustrating a transistor in accordance with example embodiments. The transistor shown in FIG. 15 may be a planar type transistor.

Referring to FIG. 15, an interface insulation layer 204 may be formed on a flat upper surface of the substrate 100. In example embodiments, the interface insulation layer 204 may include silicon oxide.

A first gate insulation layer 206 including an insulation material having a hysteresis characteristic may be formed on the interface insulation layer 204. In example embodiments, the first gate insulation layer 206 may include a ferroelectric material. In example embodiments, a thickness of the first gate insulation layer 206 may be greater than a thickness of the interface insulation layer 204.

A gate electrode 212 may be formed on the first gate insulation layer 206. The gate electrode 212 may include a metal material. In example embodiments, the first gate insulation layer 206 may be only disposed below a bottom of the gate electrode 212.

In example embodiments, the gate electrode 212 may have a structure including a barrier metal pattern 208 and a metal pattern 210 stacked on top of each other. In some example embodiments, the gate electrode 212 may have a structure including the barrier metal pattern 208, the metal pattern 210, and the polysilicon pattern stacked on top of each other. In some example embodiments, a capping pattern may be further formed on the gate electrode 212.

An impurity region 230 may be formed at an upper portion of the substrate 100 adjacent to sidewalls of the gate electrode 212.

Figure 16:
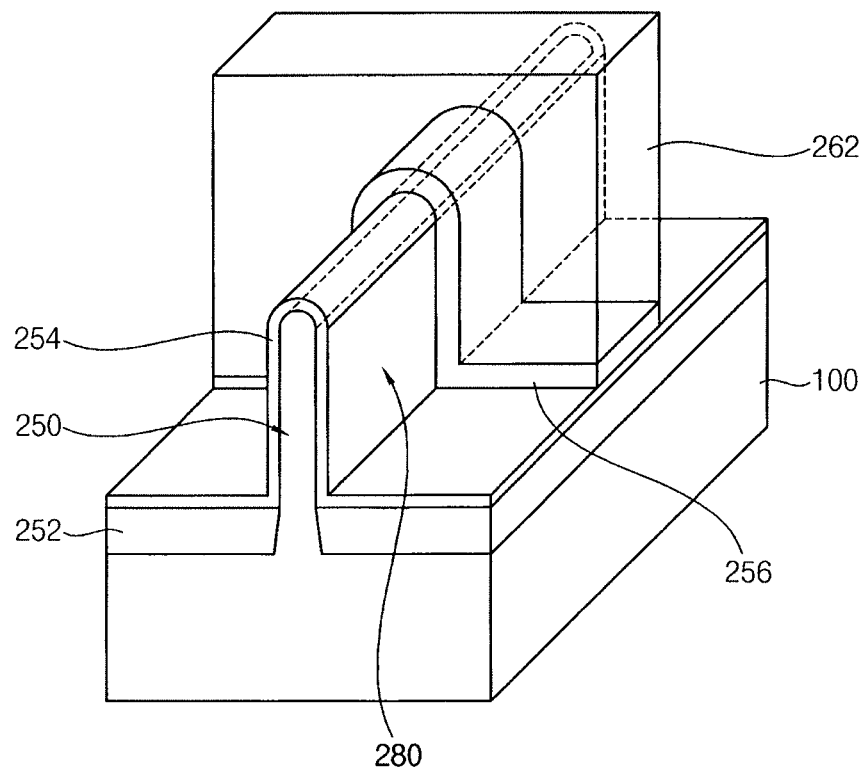
FIG. 16 illustrates a cross-sectional view of a transistor in accordance with example embodiments.

FIG. 16 is a cross-sectional view illustrating a transistor in accordance with example embodiments. The transistor shown in FIG. 16 may be a fin field effect transistor.

Referring to FIG. 16, an active fin 250 may protrude from a surface of a substrate 100, and may extend in a first direction. A device isolation pattern 252 may be formed on the substrate to cover a lower sidewall of the active fin 250.

An interface insulation layer 254 may be formed on a sidewall and a top surface of the active fin 250 exposed by the device isolation pattern 252. In example embodiments, the interface insulation layer 254 may include silicon oxide. A first gate insulation pattern 256 including an insulation material having a hysteresis characteristic may be formed on the interface insulation layer 254. In example embodiments, the first gate insulation pattern 256 may include a ferroelectric material.

A gate electrode 262 may be formed on the first gate insulation pattern 256. The gate electrode 262 may include a metal. In example embodiments, the gate electrode 262 may have a structure including a barrier metal pattern and a metal pattern stacked. An impurity region 280 serving as source/drain regions may be formed at the active fin 250 adjacent to sidewalls of the gate electrode 262.

Figure 17:
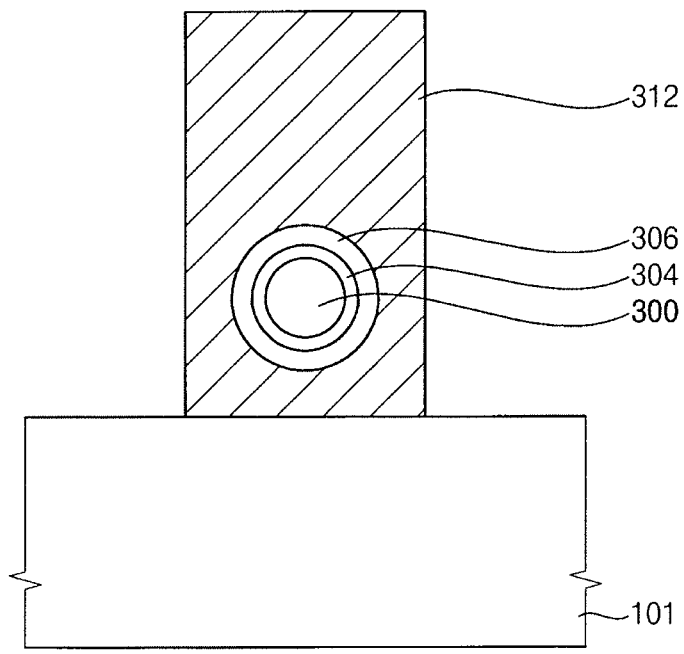
FIG. 17 illustrates a cross-sectional view of a transistor in accordance with example embodiments.

FIG. 17 is a cross-sectional view illustrating a transistor in accordance with example embodiments. The transistor shown in FIG. 17 may be a gate all around type (GAA) transistor.

Referring to FIG. 17, a nanowire 300 may be formed on a substrate 101, and the nanowire 300 may be spaced apart from the substrate. Supports may be formed on both sides of the nanowire 300.

An interface insulation layer 304 may be formed to surround a surface of the nanowire 300. A first gate insulation layer 306 including an insulation material having the hysteresis characteristic may be formed on the interface insulation layer 304.

A gate electrode 312 may be formed on the first gate insulation layer 306. The gate electrode 312 may include a metal. In example embodiments, the gate electrode 312 may have a structure including a barrier metal pattern and a metal pattern stacked. An impurity region serving as source/drain regions may be formed at the nanowire 300 adjacent to sidewalls of the gate electrode 312.

Figure 18:
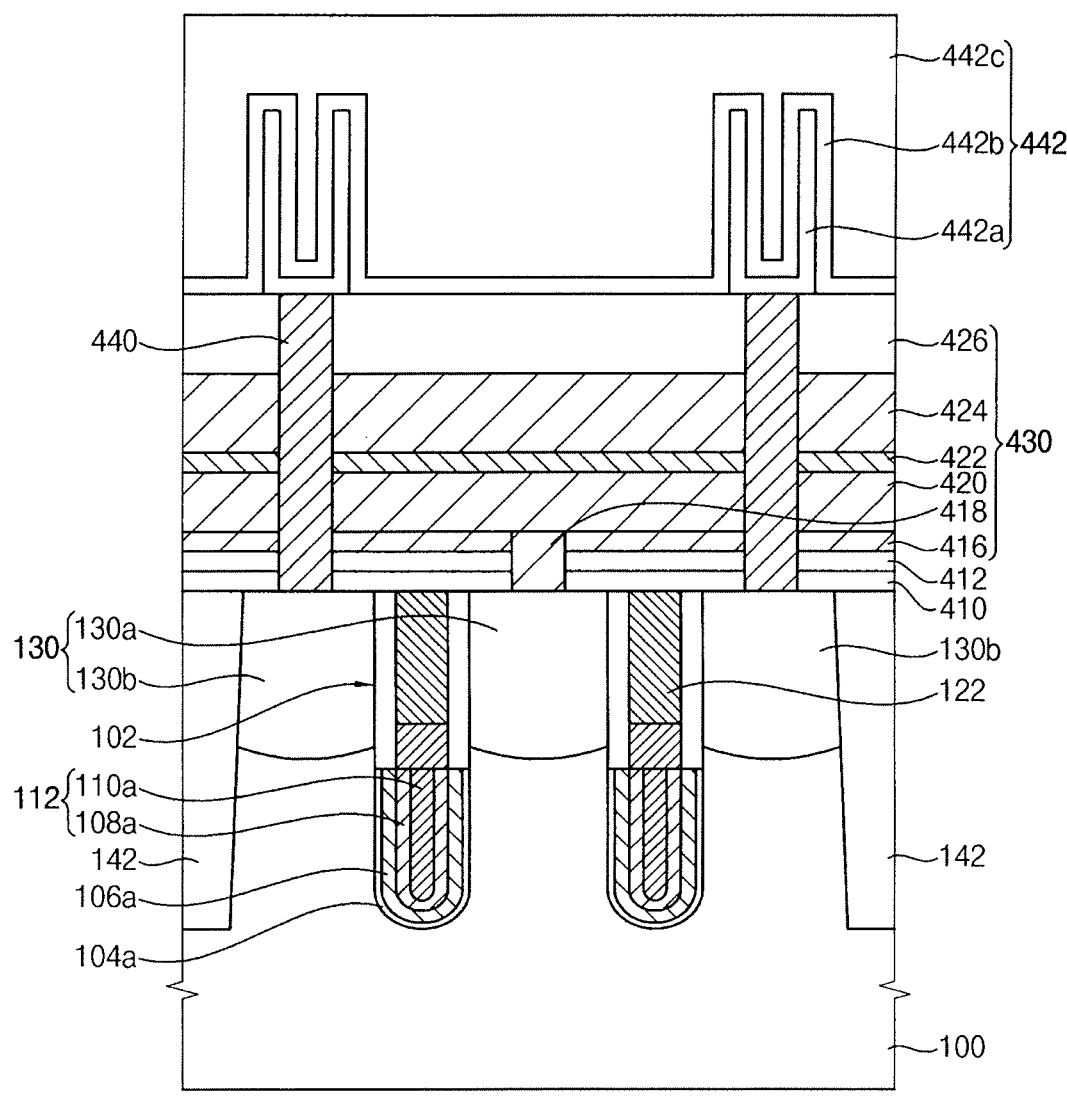
FIG. 18 illustrates a cross-sectional view of a semiconductor device in accordance with example embodiments.

FIG. 18 is a cross-sectional view illustrating a semiconductor device in accordance with example embodiments. The semiconductor device may be a DRAM device including one of transistors in accordance with example embodiments. Therefore, detailed description of the transistor is omitted. Hereinafter, the DRAM device including the transistor illustrated with reference to FIG. 1 is described.

Referring to FIG. 18, device isolation patterns 142 may be formed at the substrate 100, and an active region may be disposed between the device isolation patterns 142. The substrate 100 may include the recess 102, and a gate structure may be formed in the recess 102.

In example embodiments, the gate structure may be substantially the same as the gate structure shown in FIG. 1. The gate structure may include the interface insulation pattern 104*a*, the first gate insulation pattern 106*a*, the second gate insulation layer 116, the first gate electrode 112, the second gate electrode 120, and the capping pattern 122. In some example embodiments, the gate structure may be substantially the same as one of the gate structures shown in FIGS. 3 to 6.

In example embodiments, the gate structure may extend in the first direction parallel to a surface of the substrate 100. A plurality of gate structures may be arranged, e.g., to be spaced apart, in the second direction horizontal to the surface of the substrate 100 and perpendicular to the first direction.

The impurity region 130 serving as source/drain regions may be formed at the substrate 100 between the gate structures. For example, the impurity region 130 may include a first impurity region 130*a* electrically connected to a bit line structure 430 and a second impurity region 130*b* electrically connected to a capacitor 442.

A pad pattern 410, a first etch stop pattern 412, and a first conductive pattern 416 may be formed on the active region, the device isolation pattern 142, and the gate structure. For example, the pad pattern 410 may include an oxide, e.g., silicon oxide, and the first etch stop pattern 412 may include a nitride, e.g., silicon nitride. The first conductive pattern 416 may include, e.g., polysilicon doped with impurities.

A second recess may be disposed between structures including the pad pattern 410, the first etch stop pattern 412, and the first conductive pattern 416 stacked. That is, the second recess may be disposed on the substrate 100 between the gate structures. An upper surface of the first impurity region 130*a* may be exposed by a bottom of the second recess.

A second conductive pattern 418 may be formed in the second recess. The second conductive pattern 418 may include, e.g., polysilicon doped with impurities. That is, the second conductive pattern 418 may contact the first impurity region 130*a*.

A third conductive pattern 420 may be formed on the first conductive pattern 416 and the second conductive pattern 418. The third conductive pattern 420 may include, e.g., polysilicon doped with impurities. That is, the first to third conductive patterns 416, 418 and 420 may include substantially the same material, so that the first to third conductive patterns 416, 418 and 420 may be merged into one pattern. A barrier metal pattern 422, a metal pattern 424, and a hard mask pattern 426 may be sequentially stacked on the third conductive pattern 420.

A stacked structure including the first conductive pattern 416, the second conductive pattern 418, the third conductive pattern 420, the barrier metal pattern 422, the metal pattern 424, and the hard mask pattern 426 may serve as the bit line structure 430. For example, the second conductive pattern 418 may serve as a bit line contact. The first conductive pattern 416, the third conductive pattern 420, the barrier metal pattern 422, and the metal pattern 424 may serve as a bit line. The bit line structure 430 may extend in the second direction, and a plurality of bit line structures 430 may be arranged, e.g., spaced apart from each other, in the first direction.

In example embodiments, spacers may be formed on sidewalls of the bit line structure 430. A first interlayer insulation layer may be formed to fill a space between the bit line structures 430. The first interlayer insulation layer may include silicon oxide.

A contact plug 440 may pass through the first interlayer insulation layer, the first etch stop pattern 412 and the pad pattern 410, and the contact plug 440 may contact the second impurity region 130*b*. The contact plug 440 may be disposed between the bit line structures 430.

The capacitor 442 may be formed on the contact plug 440. The capacitor 442 may include a lower electrode 442*a*, a dielectric layer 442*b*, and an upper electrode 442*c* stacked on top of each other. The lower electrode 442*a* of the capacitor 442 may have a cylindrical shape or a pillar shape.

As described above, a semiconductor device according to embodiments may include a transistor with an insulation material having a hysteresis characteristic. The transistor may have a first threshold voltage Vth1 in a turn-off state, and a second threshold voltage Vth2 (lower than the first threshold voltage Vth1) in a turn-on state. Thus, leakage currents may be decreased in the turn-off state. Also, the operating speed may be increased in the turn-on state.

A memory cell of the semiconductor device according to embodiments may include the transistor described above and a capacitor. The memory cell may be selected by the transistor, and charge may be stored in the capacitor of the memory cell. Thus, data may be written in the memory cell.

In an operation of writing data to the memory cell, a turn-on voltage may be applied to a gate so that the transistor may be turned on. That is, in the operation of writing data, the gate voltage Vg may be increased to the turn-on voltage, shown in the states 1 to 3 of FIG. 2. In this case, the transistor has the second threshold voltage Vth2 of relatively low value, so that ON currents may be increased. Therefore, the operation speed of writing data may be increased.

After writing data in the memory cell, the transistor may be turned off. Also, the data may be maintained in the memory cell. Also, after writing data in the memory cell, the gate voltage Vg may drop to the turn-off voltage, as shown in the states 4 to 5 state of FIG. 2.

After writing data in the memory cell, the transistor may have the first threshold voltage Vth1 of relatively high value. Therefore, the leakage currents of the transistor may be decreased, and a data retention characteristic of the memory cell may be improved.

On the other hand, as the charge stored in the capacitor may be leaked by passing time, a refresh operation of the memory cell may be performed at regular intervals. In the refresh operation, a turn-on voltage may be applied to a gate, so that the transistor may be turned on. Also, when the refresh operation is completed in the memory cell, the transistor may be turned off, and an original data may be maintained in the memory cell. As the refresh operation is performed at regular intervals, the transistor may be periodically turned on and turned off.

On the other hand, after the transistor has the first threshold voltage Vth1, the polarity of the first gate insulation layer may be reduced by passing time, and thus level of the first threshold voltage Vth1 may be lowered. However, when the refresh operation of the memory cell may be performed at regular intervals, the first threshold voltage Vth1 may be increased to a level of a target threshold voltage. Therefore, the first threshold voltage Vth1 may not be lowered below the target threshold voltage.

Therefore, a value of a turn-on current/turn-off current of the transistor may increase, and thus the memory cell may have excellent operation characteristics and electrical characteristics.

By way of summation and review, in example embodiments, a transistor of a semiconductor device may include one of the first threshold voltage and the second threshold voltage different from the first threshold voltage depending on a voltage level (or a voltage state) of the first gate electrode. A value of on/off current (i.e., a ratio between on/off current) of the transistor may increase, so that the transistor may be operated to have a high speed and low leakage currents. Thus, the semiconductor device may have excellent electrical characteristics.

That is, the transistor of the semiconductor device, according to example embodiments, may include a gate insulation layer including a ferroelectric material having hysteresis characteristics. Thus, a threshold voltage of the transistor may vary depending on the operating state of the transistor. That is, the transistor may have a relatively high first threshold voltage in a turn-off state, and a relatively low second threshold voltage in a turn-on state, so the transistor may have a high ON current and a low OFF current.

In addition, the gate electrode may have a structure including a metal and polysilicon stacked on top of each other, and the ferroelectric material may contact a portion of the gate electrode. Defects due to formation of the ferroelectric material may be decreased by reducing the area of the ferroelectric material, so leakage currents of the transistor due to the defects may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor device, comprising:
    a substrate including a recess;
    a first gate insulation layer on a lower sidewall and a bottom of the recess, the first gate insulation layer including an insulation material having hysteresis characteristics;
    an interface insulation layer between a surface of the recess and the first gate insulation layer, a first thickness of the interface insulation layer being less than a second thickness of the first gate insulation layer;
    a first gate electrode on the first gate insulation layer inside the recess;
    a second gate electrode contacting the first gate electrode in the recess, the second gate electrode including a material different from a material of the first gate electrode;
    a second gate insulation layer between the recess and the second gate electrode, the second gate insulation layer being on a top surface of the first gate insulation layer and including a material different from a material of the first gate insulation layer; and
    impurity regions on the substrate and adjacent to sidewalls of the recess, bottoms of the impurity regions being higher than a bottom of the second gate electrode relative to a bottom of the substrate.

2. The semiconductor device as claimed in claim 1, wherein the first gate insulation layer includes a ferroelectric material.

3. The semiconductor device as claimed in claim 2, wherein the first gate insulation layer includes at least one of hafnium oxide, zirconium oxide, yttrium-doped zirconium oxide, yttrium-doped hafnium oxide, magnesium-doped zirconium oxide, magnesium-doped hafnium oxide, silicon-doped hafnium oxide, silicon-doped zirconium oxide, and barium-doped titanium oxide.

4. The semiconductor device as claimed in claim 1, wherein the second gate insulation layer is directly on topmost surfaces of both the interface insulation layer and the first gate insulation layer, a bottom surface of the second gate insulation layer being coplanar with a bottom surface of the second electrode.

5. The semiconductor device as claimed in claim 1, wherein:
    each of the interface insulation layer and the second gate insulation layer includes silicon oxide,
    the first gate insulation layer includes a ferroelectric material, the first gate insulation layer being in direct contact with a side surface of the interface insulation layer and with a bottom surface of the second gate insulation layer, and
    a third thickness of the second gate insulation layer equals a sum of the first thickness of the interface insulation layer and the second thickness of the first gate insulation layer.

6. The semiconductor device as claimed in claim 1, wherein a thickness of the second gate insulation layer is thicker than the second thickness of the first gate insulation layer.

7. The semiconductor device as claimed in claim 1, wherein the first gate electrode includes a metal, and the second gate electrode includes a polysilicon.

8. The semiconductor device as claimed in claim 1, wherein the second gate electrode includes a material having a work function different from a work function of the first gate electrode.

9. The semiconductor device as claimed in claim 8, wherein a difference between the work function of the second gate electrode and a work function of the impurity region is less than a difference between the work function of the first gate electrode and the work function of the impurity region.

10. The semiconductor device as claimed in claim 1, wherein the semiconductor device includes a transistor, the transistor having one of a first threshold voltage and a second threshold voltage different from the first threshold voltage depending on a voltage level of the first gate electrode.

11. The semiconductor device as claimed in claim 10, wherein:
    the transistor has the first threshold voltage in a turn-off state of the transistor, and the second threshold voltage in a turn-on state of the transistor, and
    the first threshold voltage is higher than the second threshold voltage.

12. A semiconductor device, comprising:
    a transistor including:
        an interface insulation layer on a substrate, the interface insulation layer having a first thickness,
        a first gate insulation layer on the interface insulation layer, the first gate insulation layer having a second thickness greater than the first thickness, and including an insulation material having a hysteresis characteristic;
a first gate electrode on the first gate insulation layer, a top surface of the interface insulation layer being higher than a top surface of the first gate electrode relative to a bottom surface of the first gate electrode, and
impurity regions on the substrate and adjacent to sidewalls of the first gate electrode,
wherein the transistor has one of a first threshold voltage and a second threshold voltage different from the first threshold voltage depending on a voltage level of the first gate electrode.

13. The semiconductor device as claimed in claim 12, wherein the first gate insulation layer includes a ferroelectric material, and the interface insulation layer includes silicon oxide.

14. The semiconductor device as claimed in claim 12, wherein the top surface of the interface insulation layer is higher than a top surface of the first gate insulation layer relative to the bottom surface of the first gate electrode.

15. The semiconductor device as claimed in claim 12, further comprising a capacitor electrically connected to one of the impurity regions.

16. The semiconductor device as claimed in claim 12, wherein:
the transistor has the first threshold voltage in a turn off state of the transistor, and the second threshold voltage in a turn on state, and
the first threshold voltage is higher than the second threshold voltage.

17. A semiconductor device, comprising:
a transistor including:
a substrate including a recess,
an interface insulation layer on a lower sidewall and a bottom of the recess,
a first gate insulation layer on the interface insulation layer, the first gate insulation layer including a ferroelectric material, and the first gate insulation layer being thicker than the interface insulation layer,
a first gate electrode on the first gate insulation layer to fill a lower portion of the recess, the first gate electrode including a metal,
a second gate electrode contacting the first gate electrode in the recess, the second gate electrode including a material different from a material of the first gate electrode,
a second gate insulation layer between the recess and the second gate electrode, the second gate insulation layer being directly on top surfaces of both the first gate insulation layer and the interface insulation layer, and the second gate insulation layer including a material different from a material of the first gate insulation layer, and
impurity regions on the substrate and adjacent to sidewalls of the recess; and
a capacitor electrically connected to one of the impurity regions of the transistor, wherein the transistor has one of a first threshold voltage and a second threshold voltage different from the first threshold voltage depending on a voltage level of the first gate electrode.

18. The semiconductor device as claimed in claim 17, wherein a height of bottoms of the impurity regions is between heights of a bottom and a top of the second gate electrode relative to a bottom of the substrate.

19. The semiconductor device as claimed in claim 17, wherein the second gate insulation layer includes silicon oxide, the second gate insulation layer being thicker than the first late insulation layer.

20. The semiconductor device as claimed in claim 1, wherein the first gate insulation layer is positioned under the second gate electrode, an entirety of the first gate insulation layer and an entirety of the second gate electrode having a non-overlapping relationship in a horizontal direction.

* * * * *